United States Patent [19]

Hiratsuka et al.

[11] Patent Number: 5,680,027
[45] Date of Patent: Oct. 21, 1997

[54] BATTERY PACK INCLUDING INTERNAL CAPACITY MONITOR FOR MONITORING GROUPS OF BATTERY CELLS

[75] Inventors: Masaru Hiratsuka, Kanagawa; Shigeki Murayama, Tokyo; Tamiji Nagai, Kanagawa; Yasuhito Eguchi, Kanagawa; Kaoru Tomono, Kanagawa, all of Japan

[73] Assignee: Sony Corporation, Japan

[21] Appl. No.: 256,031

[22] PCT Filed: Oct. 22, 1993

[86] PCT No.: PCT/JP93/01536

§ 371 Date: Sep. 2, 1994

§ 102(e) Date: Sep. 2, 1994

[87] PCT Pub. No.: WO94/10718

PCT Pub. Date: May 5, 1994

[30] Foreign Application Priority Data

Oct. 23, 1992 [JP] Japan ................... 4-286474

[51] Int. Cl.⁶ .............. H01M 10/44; H01M 10/46
[52] U.S. Cl. .................... 320/2; 320/15; 320/48
[58] Field of Search ................. 320/5, 2, 15, 6, 320/30, 32, 39, 40, 48

[56] References Cited

U.S. PATENT DOCUMENTS 4,455,523  6/1984  Koenck .................... 320/43
4,965,738  10/1990  Bauer et al. ............ 320/48 X
5,191,277  3/1993  Ishikura et al. ........... 320/22

FOREIGN PATENT DOCUMENTS 0394074  10/1990  European Pat. Off. .
4127075  4/1992  Japan .
4150727  5/1992  Japan .
4351428  12/1992  Japan .
0496537  7/1992  United Kingdom .

*Primary Examiner*—Edward Tso
*Attorney, Agent, or Firm*—Ronald P. Kananen

[57] ABSTRACT

A battery pack (1) is connected to an external equipment (9) and to a power source circuit (10) designed to supply the power to the external equipment (9). The communication of the information is made between a micro-computer (11) in the battery pack (1) and the external equipment (9) via a terminal (8). At least the information indicating the present residual capacity of a battery main unit (4) is transmitted by such communication from the micro-computer (11) to the external equipment (9). The residual capacity is found by the calculations performed by the micro-computer (11) on the current, voltage, internal resistance and the temperature of the battery main unit (4). In this manner, the residual capacity may be accurately found on the side of the external equipment (9).

18 Claims, 9 Drawing Sheets

BATTERY PACK INCLUDING INTERNAL CAPACITY MONITOR FOR MONITORING GROUPS OF BATTERY CELLS

TECHNICAL FIELD

This invention relates to a battery pack employed as a power source for a portable telephone, personal computer or a video camera.

BACKGROUND ART

There has hitherto been known a battery pack constituted by a secondary battery, such as a lithium ion, NiCd or nickel hydrogen battery. Such known battery pack is in need of a protective circuit which is arranged at a pre-set position within the battery pack. A charging control circuit is separately provided on a charger such as an ac adapter or on an external unit such as a personal computer employing the battery pack. If the excess discharging state is detected, the discharge is discontinued appropriately.

However, the voltage at each cell cannot be detected if based solely upon the terminal voltage of the battery pack, such that the residual capacity cannot be measured accurately. Besides, if any one of the cells reaches a pre-set excess discharge (over-discharge voltage), the discharge is discontinued without regard to the terminal voltage.

This is particularly inconvenient with an equipment, such as a personal computer, in which it is necessary to carry out an operation of data storage before discontinuing the discharge.

Consequently, it is necessary to provide a system for detecting the status of the battery based upon the information stored in the battery pack.

In view of the above-described status of the art, it is an object of the present invention to provide a battery pack in which the information concerning the secondary battery of the battery pack is suitably transmitted to an external equipment in order to enable accurate and precise information concerning the battery to be obtained quickly.

DISCLOSURE OF THE INVENTION

A battery pack according to the present invention is connected to a power source circuit and to an external equipment connected to the power source circuit, and comprises a secondary battery charged and discharged and made up of a plurality of cells, and a control circuit for controlling the charging/discharging of the secondary battery. The control circuit has means for detecting the status information of the secondary battery and controlling the charging/discharging and calculating the residual capacity of the secondary battery based upon the status information. Such means also transmit the information indicating at least the residual capacity to the external equipment.

Thus, by transmitting the battery information produced by the control circuit to the external equipment, the accurate and precise information concerning the battery, above all its residual capacity, may be produced expeditiously.

Besides, if trouble occurs with the battery pack, the relevant information is transmitted to the external equipment having the battery pack loaded thereon before an inconvenience is produced by such trouble.

By providing the identification information specific to the battery pack (battery pack ID), it is possible to ensure use of the correct battery even though the size and the terminal of another battery type are the same. The battery pack ID includes the model number, version, cell configuration and the battery type, such as lithium ion battery, NiCd battery or the nickel hydrogen battery.

The contents of the communication from the control circuit to the external circuit includes the present capacity, current value, voltage value, number of times of charging, maximum capacity and voltage values of the cells.

It is preferred that the inner setting in the control circuit may be modified based upon the setting information transmitted from the external equipment. The setting information includes that for the discharge cessation premonitory voltage for the second battery.

The control circuit returns a data code responsive to the query information transmitted from the external equipment. The data code has a general code portion used as a response to an arbitrary query and a specified portion used as a response to a specified query.

The data code is a 8-bit word code, with a portion of 256 codes represented by the eight bits being used as numerical figures allocated to the general code portion, with the remaining portion of the 256 words being used as the specific code portion.

BEST MODE FOR CARRYING OUT THE INVENTION

Figure 1:
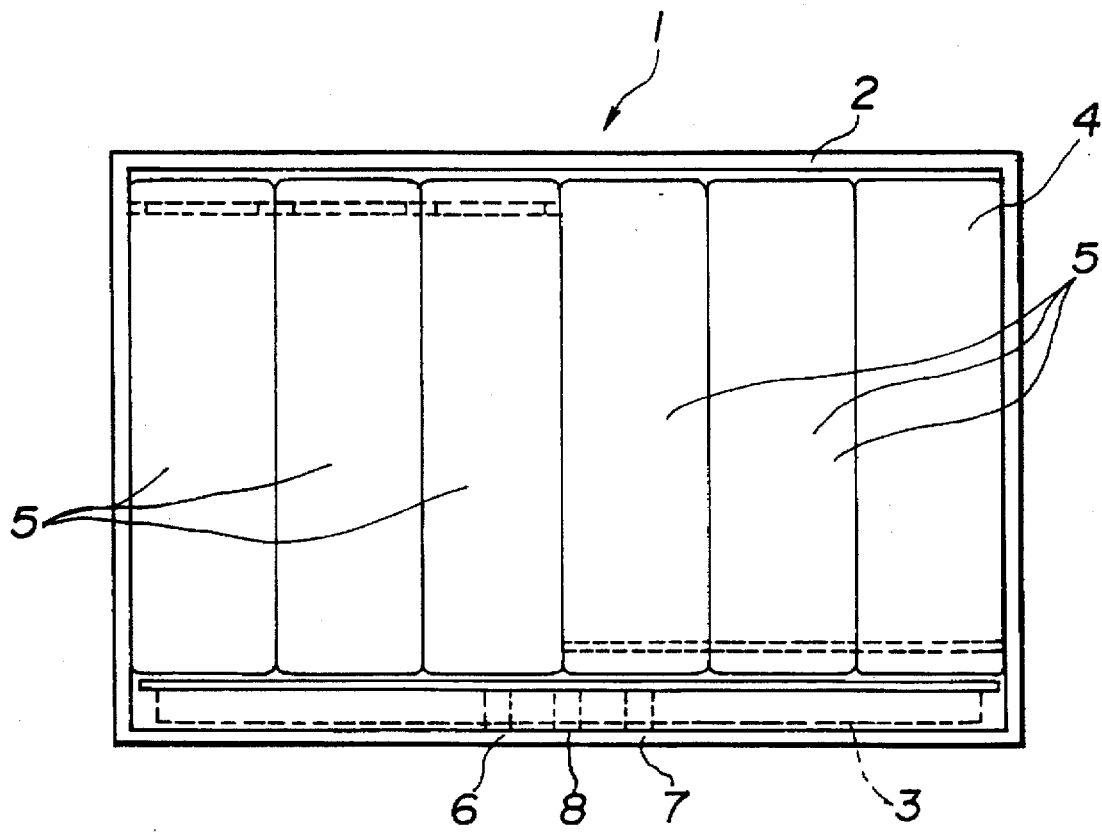
FIG. 1 is a schematic plan view showing a structure of an embodiment of a battery pack according to the present invention.

Referring to the drawings, preferred embodiments of the battery pack according to the present invention will be explained.

A battery pack 1 of the present embodiment is made up of a control/protection circuit 3 and a main battery unit 4, both of which are provided within a container casing 2, as shown in FIG. 1. The control/protection circuit 3, with a built-in charge/discharge control function, a built-in communication function and a protective circuit, is suitably arranged in position within the container casing 2.

The main battery unit 4 is comprised of, for example, six cells 5. These six cells 5, termed 3P-2S, are comprised of two series connection of two sets of cells, each set being made up of three cells connected in parallel.

The main battery unit 4 also includes a negative terminal 6, a positive terminal 7 and an external connection terminal 8 at suitable positions capable of being connected to an external charger and to an external equipment 9 provided external to the container casing 2.

The number of cells 5 of the battery main unit 4 is not limited to six and may be suitably increased or decreased. The connecting state of the cells 5 may also be changed in any desired manner.

Figure 2:
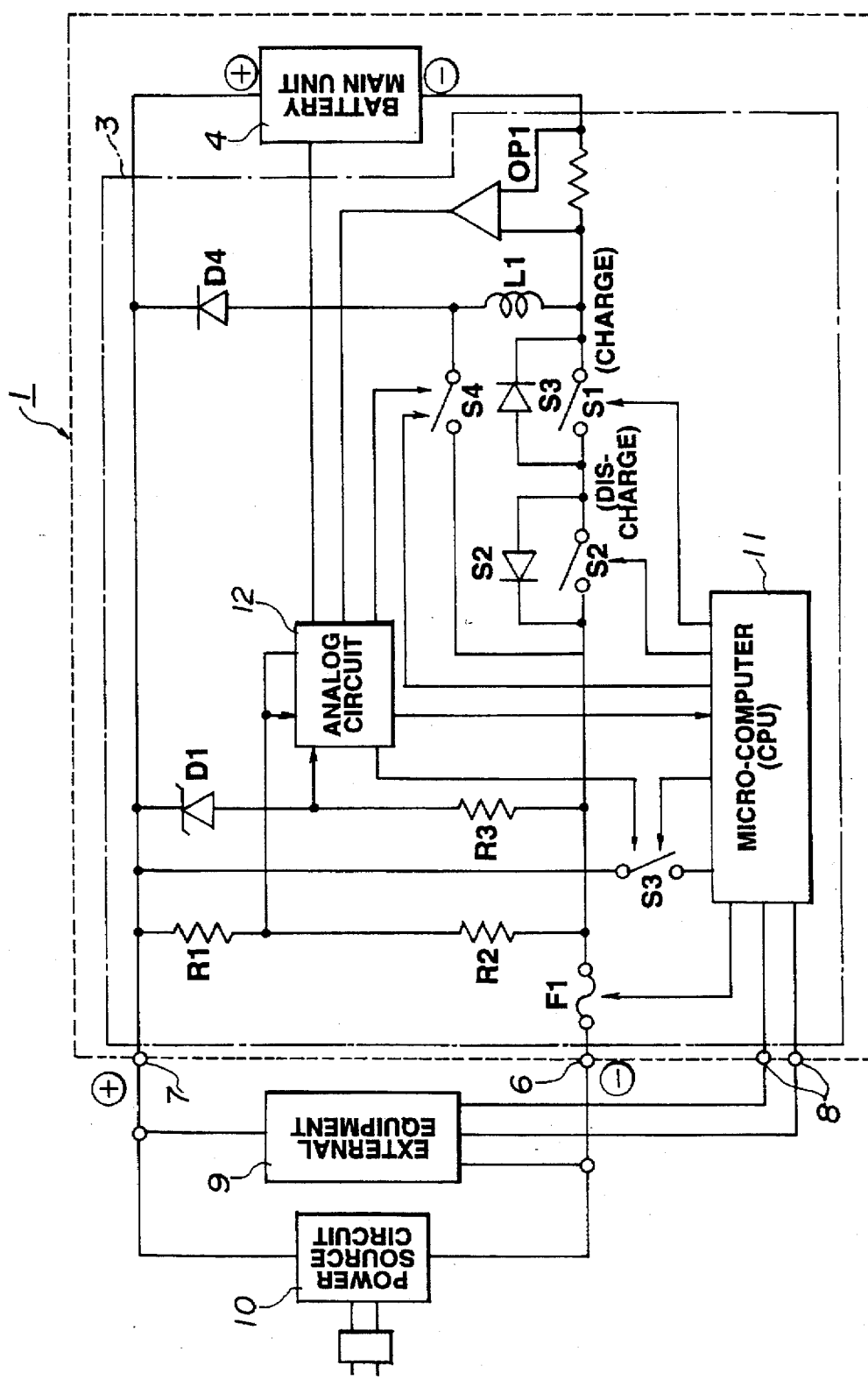
FIG. 2 is a schematic block circuit diagram showing, along with a peripheral circuit, the structure of a circuit of the embodiment of the battery pack according to the present invention.

The battery pack 1, comprised of the control/protection circuit 3 and the main battery unit 4, has its negative terminal 6, positive terminal 7 and the external connection terminal 8 connected to the negative and positive sides of the external equipment 9 and a power source circuit 10, such as an ac/dc converter, and to the external equipment 9, as shown in FIG. 2, respectively, in order to effect the charge/discharge operations by the main battery unit 4.

The control/protection circuit 3 is comprised of a micro-computer 11, an analog circuit 12, resistors R3 and R4, diodes D1, D2 and D3, switches S1, S2, S3 and S4 and an operational amplifier OP1.

The state of interconnection between the control/protection circuit 3 and the main battery unit 4 is now explained.

The positive terminal 7, connected with the positive sides of the external equipment 9 and the charger 10, is connected to an end of a resistor R1, an end of the control/protection circuit 3, a cathode side of the diode D1 and to a positive terminal of the main battery unit 4.

The resistor R1 has its other end connected to an end of a resistor R2 and to a terminal of the analog circuit 12.

The resistor R2 has its other end connected via a fuse F1 to the negative terminal 6.

The resistor R3 has its one end connected to the anode side of the diode D1 and to an input terminal of the analog circuit 12, while having its other end connected via the fuse F1 to the negative terminal 6.

The resistor R4 has its one end connected to the switch S1, the cathode side of the diode D3, the other end of a coil L1 and to one input terminal of the operational amplifier OP1, while having its other end connected to the other input terminal of the operational amplifier OP1 and to the negative terminal of the battery main unit 4.

The diode D1 is a Zener diode which has its anode side connected to one end of the resistor R3 and to the input terminal of the analog circuit 12 and which has its cathode side connected to the positive terminal 7.

The diode D2 has its anode side connected to one terminal of the switch S1, the other terminal of the switch S2 and to the anode side of the diode D3, while having its cathode side connected via the fuse F1 to the negative terminal 6.

The diode D3 has its anode side connected to one terminal of the switch S1, the other terminal of the switch S4 and to the anode side of the diode D2, while having its cathode side connected to the other terminal of the switch S1, the other terminal of the coil L1, the one input terminal of the operational amplifier OP1 and to one terminal of the resistor R4.

The diode D4 has its anode side connected to one terminal of the coil L1 and to the other terminal of the switch S4, while having its cathode side connected to the positive terminal 7.

The switch S1, which is turned on during the charging operation of the battery main unit 4, has its one terminal connected to the anode side of the diode D3, one terminal of the switch S4, the anode side of the diode D3 and to the other terminal of the switch S2, while having its other terminal connected to the cathode side of the diode D3, the other terminal of the coil L1, the one input terminal of the operational amplifier OP1 and to one terminal of the resistor R4, and having its control terminal connected to an output terminal of the micro-computer (CPU) 11.

The switch S2, which is turned on during the discharging of the battery main unit 4, has its one terminal connected via the fuse F1 to the negative terminal 6 and to the cathode side of the diode D2, while having its other terminal connected to the anode side of the diode D2, one terminal of the switch S4, the anode side of the diode D3 and to one input terminal of the switch S1 and having its control terminal connected to the output terminal of the micro-computer (CPU) 11.

The switch S4, which is turned on and off based upon the command from the micro-computer 11 and the analog circuit 12, has its one terminal connected to the other terminal of the switch S2, the anode side of the diode D2, the anode side of the diode D3 and to one terminal of the switch S1, while having its other terminal connected to the anode side of the diode D4 and to one terminal of the coil L1 and its control terminal connected to the output terminal of the micro-computer 11 and to the output terminal of the analog circuit 12.

The operational amplifier OP1, detecting the excessive current and the directivity, that is charging or discharging, is connected to the other terminal of the switch S1, the cathode side of the diode D3, the other terminal of the coil L1 and to the negative side of the battery main unit 4.

The fuse F1, which is turned on and off based upon the signal from the micro-computer 11, has its one terminal connected to the negative terminal 6, while having its other terminal connected to the other terminal of the resistor R2, the other terminal of the resistor R3, the cathode side of the diode D2 and to one terminal of the switch S2 and its control terminal connected to the output terminal of the micro-computer 11.

The micro-computer 11, controlling the charging/discharging of the battery main unit 4 and the protective circuit inclusive of the analog circuit 12, has plural input terminals, that is terminals controlling the switches S1 to S4, a terminal for acquiring the information from the analog circuit 12, a terminal connected to the other terminal of the switch S3, a terminal controlling the fuse F1 and the external control terminal 8 controlling the external equipment 9.

The analog circuit 12, comprised of a circuitry for controlling the battery main unit 4 and for accommodating for shorting or the like, has an input terminal supplied with signals from the battery main unit 4, a terminal supplied with signals from the operational amplifier OP1, a terminal for controlling the switches S3 and S4, a terminal for transmitting the information to the micro-computer 11 and a terminal for detecting unusual input/output voltages.

The protection circuit 3 may also be comprised of the diode D1 and the resistor R3 and designed to detect the unusual input voltage. Such protection circuit plays the role of preventing the charging from the power source when for example the voltage of the power source circuit reaches an unusual value.

In addition, the analog circuit 12 monitors the states of the cells 5 of the battery main unit 4. That is, the analog circuit 12 detects the state of voltage or the charge/discharge current of each cell 5 and suitably transmits the detected state to the micro-computer 11.

For example, if the charge/discharge operation of the battery main unit 4 is completed, a signal indicating that effect is sent to the micro-computer 11 for turning the switch S2 off. On the other hand, if unusual situations arise in the battery main unit 4 during the charging operation or the discharging operation, such as when the excessively charged state or the excessively discharged state has occurred, the analog circuit 12 controls the switch S1 or S2 to halt the charging operation or the discharging operation.

If, during charging of the battery pack 1 by the power source circuit 10, such as an ac/dc converter, the charging voltage deviates significantly from the design value, the analog circuit 12 detects the partial voltage values from the protection circuit made up of the resistors R1 and R2 and transmits a signal stopping the charging operation to the micro-computer 11. The micro-computer 11 breaks the fuse F1 responsive to this signal in order to prevent the battery main unit 4 from being destroyed.

In this manner, by providing various protection circuits in the battery pack 1 instead of within the power source circuit 10 and by incorporating control circuits performing various control operations in the battery pack 1, the battery pack 1 itself is able to achieve the protection of the cells 5 and the charging/discharging control.

The operation of the control/protection circuit 3 is controlled in accordance with the pre-set flowchart stored within the micro-computer 11. Referring to FIGS. 3 to 7, a typical set of operations for a 3P-2S type battery pack, comprising three parallel rows each consisting of two series connected cell groups, is explained.

Figure 3:
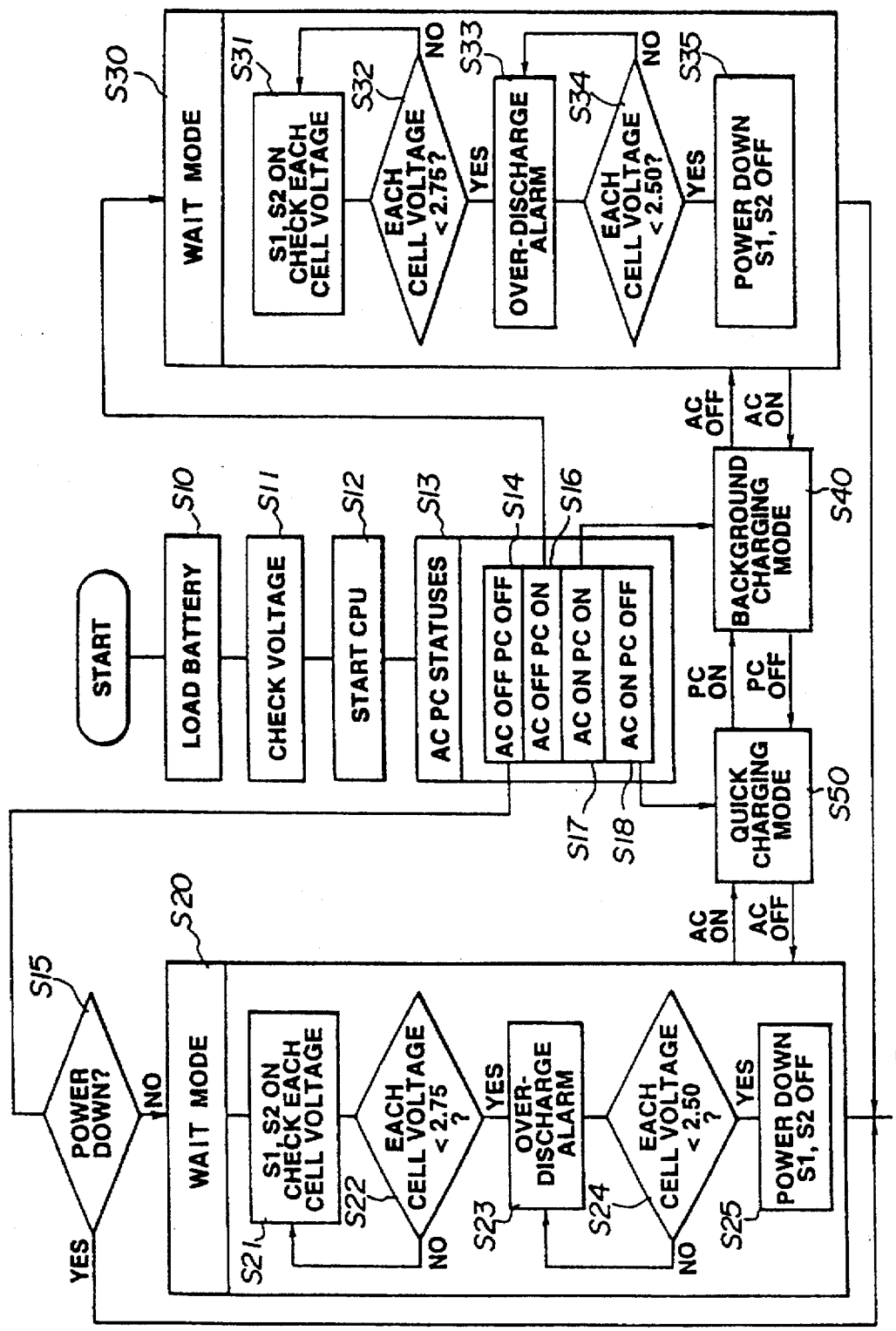
FIG. 3 is a flowchart for schematically illustrating the overall charge/discharge control operations of the embodiment shown in FIGS. 1 and 2.

Referring to FIG. 3, when the battery pack is loaded at a step S10, the voltage is checked at a step S11 by the analog circuit 12. Specifically, the partial voltage values from the voltage divider circuit made up of the resistors R1 and R2 are detected by the analog circuit 12 in order to check whether or not the voltage is within the normal voltage range. If the voltage is the normal voltage, control proceeds to a step S12 for starting the micro-computer (CPU) 12 within the battery pack 1.

At the next step S13, the status of the ac power source of the power source circuit 10, the status of the personal computer (PC) as a specific example of the external equipment 9, that is the AC (power source)/PC (external equipment) status, is detected in order to proceed to branching to various modes depending on the thus detected AC or PC states.

That is, if the AC/PC status is found to be AC (power source) off and the PC (external equipment) off (S14), control proceeds to a step S15 to decipher whether or not the power down state exists. If the result of decision is YES (power down), the operation is ended. If the result is NO, control proceeds to the wait or stand-by mode S20. If the AC/PC state is found at the step S13 to be AC (power source) off and the PC (external equipment) on (S16), control proceeds to a discharge mode (S30). If the AC/PC state is found at the step S13 to be AC (power source) on and the PC (external equipment) on (S17), control proceeds to a background charging mode (S40). If the AC/PC state is found at the step S13 to be AC (power source) on and the PC (external equipment) off (S18), control proceeds to a quick charging mode (S50).

Among these modes, the discharge mode (S30) is the mode of driving the external equipment 9, such as the personal computer, with the battery. During this mode, both the switches S1 and S2 are turned on in order to detect the voltage of the cells 5 in the battery main unit 4 (in effect, the cells connected in parallel). The reason of detecting the cell voltage in the battery main unit 4 is that, since the cells are discharged and the voltage is thereby lowered, the voltage is checked so that, at the next step S32, the voltage values in the cells 5 are checked as to whether or not these voltage values become lower than a pre-set threshold voltage, such as 2.75 V, which represents the excessively discharged state.

If the voltage state in each cell 5 becomes lower than the above-mentioned threshold value (2.75 V), control proceeds to the next step S33 to issue an alarm that the excessively discharged state exists and to prompt the external equipment to stop its operation. At the next step S34, it is checked whether or not the voltage is lower than the voltage from which re-charging becomes impossible, such as 2.50 V. Until the voltage is reached, the discharge is continued while simultaneously the alarm concerning the excessively discharged state is issued in order to enable the processing for data protection by, for example, the personal computer.

If the voltage is found at the step S34 to be lower than the voltage of 2.50 V, control proceeds to the step S35 to force the power-down state of the battery pack 1. The switches S1 and S2 are both turned off to terminate the power supply to the external equipment 9.

Among the above-mentioned various modes, the operation in the wait mode S20 is the same as that for the discharge mode S30. However, since the external equipment 9 is turned off, the discharge current is extremely low. Since the operating steps S21, S22, S23, S24 and S25 of the wait mode S20 correspond to the operating steps S31, S32, S33, S34 and S35, the explanation is not made for clarity.

Figure 4:
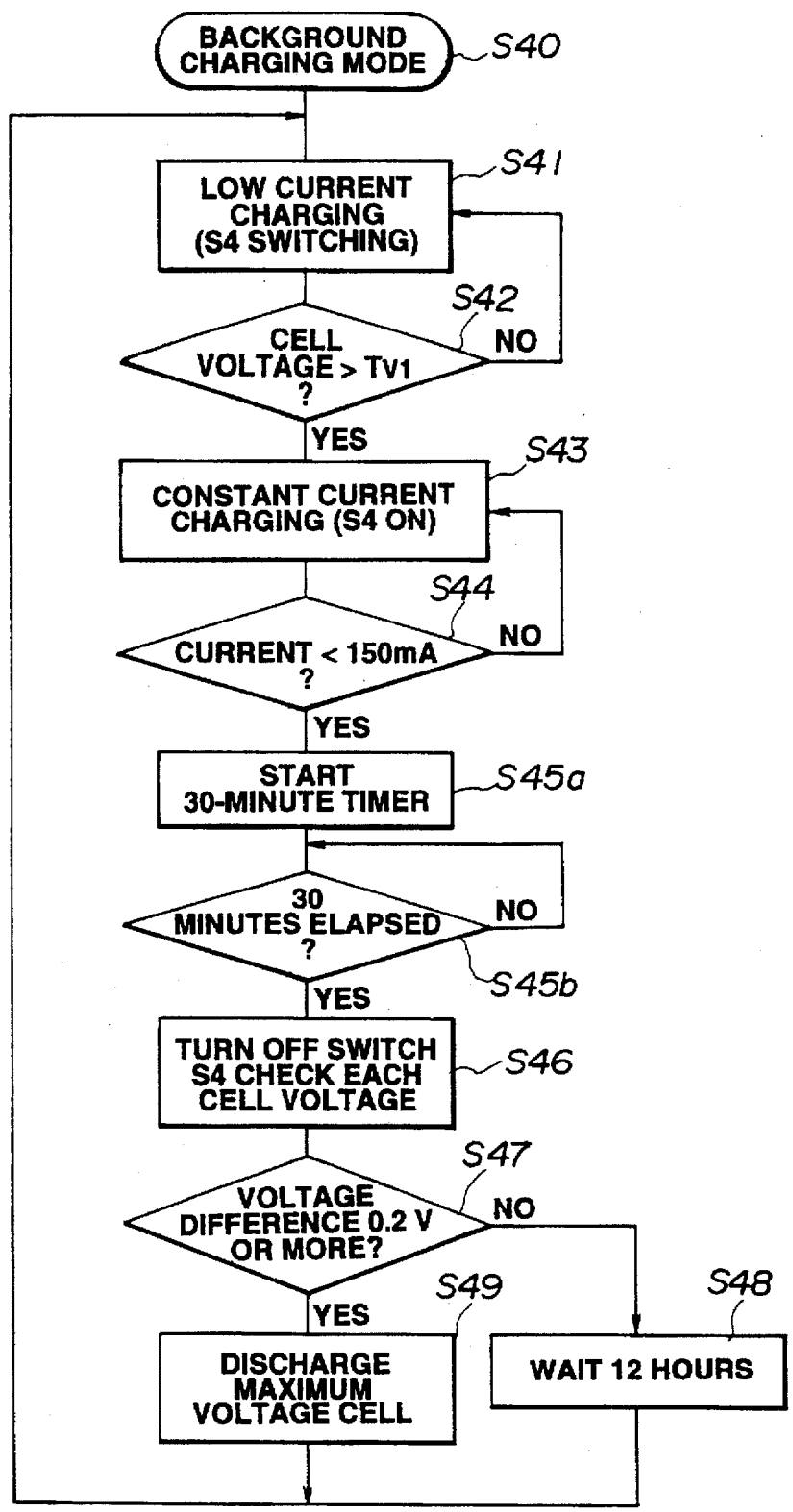
FIG. 4 is a flowchart for illustrating the background charging mode among the charge/discharging control operations of the embodiment shown in FIGS. 1 and 2.
Figure 5:
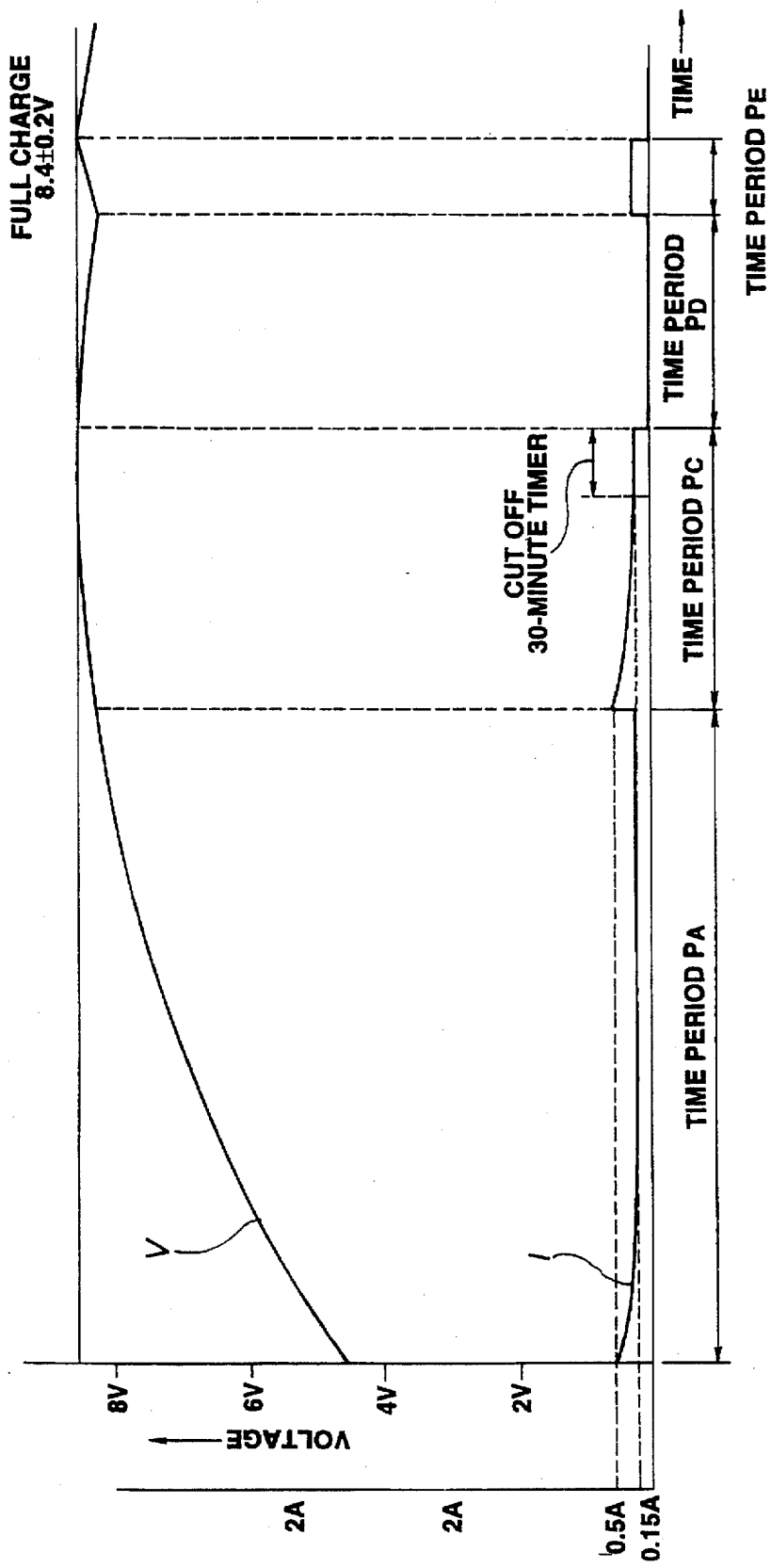
FIG. 5 is a graph showing changes in the current and the voltage with lapse of time in the background charging mode.

The background charging mode S40, which is set when the AC (power source) is on and the PC (external equipment) is on (S17), is explained by referring to the flowchart of FIG. 4 and the charge transition or charge process diagram of FIG. 5.

The background charging mode, which is set when the AC/PC state is the AC (power source) on and the PC (external equipment) on, is the mode in which the battery main unit 4 of the battery pack 1 is charged during the time when the external equipment 9 is turned on and the power is supplied from the power source circuit 10 to the external equipment 9. During the background charging mode, the residual small current (background current) supplied from the power source circuit 10 to the external circuit 9 is utilized to perform the charging.

During the background charging mode S40, the low current charging as shown by a step S41 is performed for the first stage period $P_A$. The low current charging is such charging in which the switch S4 is changed over at a pre-set frequency under control by the micro-computer (CPU) 11 in order to cause the pre-set small current (background current) to flow through the battery main unit 4 for charging. This small current or background current is the residual current equal to the maximum supply current to the power source circuit 10 less the maximum current consumed by the external circuit 9, and amounts to one-fifth to one-tenth, for example, one-eighth of the usual charging current. Thus the current is equal to approximately 0.5 A in the present embodiment. If charging is performed within a range not exceeding this small current value, there is no inconvenience caused even when the current consumed by the external equipment 9 becomes maximum.

The switching frequency may for example be on the order of 20 kHz. It is however preferred to control the switching frequency or the pulse width to stabilize the charging current at the above-mentioned small current value of 0.5 A with the aid of the so-called dc chopper configuration.

This low current charging is continued until it is determined at a step S42 that the cell voltage has exceeded a pre-set voltage threshold $T_{v1}$. The threshold value $T_{v1}$ is set to, for example, 3.5V to 4.0V.

When it is determined at the step S42 that the cell voltage has exceeded the threshold value $T_{v1}$, the charging period proceeds to a second stage period $P_c$ when the constant voltage charging at a step S43 is performed. This constant voltage charging is performed under a constant voltage, for example, in a substantially constant voltage range of from about 8.2 V to a full-charge voltage of 8.4V±0.2V, with the switch S4 being maintained in the turned-on state. The charging current at this time is designed not to exceed the above-mentioned small current or the background current. This may be achieved by pre-setting the condition of transfer from the period $P_A$ to the period $P_C$, such as the threshold value $T_{V1}$ of the cell voltage, in such a manner that the charging current may be suppressed to a value smaller than the background current even although the switch S4 is perpetually maintained in the turned-on state.

If, as a result of the constant voltage charging, the charging current I is found to be smaller than a pre-set current value, such as 150 mA, control proceeds to a step S45a to start e.g. a 30-minute timer. It is then checked at a step S45b whether or not the time period of 30 minutes has elapsed. After the lapse of the 30-minute period, control proceeds to the next step S46. This 30-minute charging is termed a charging for assurance. That is, charging is continued for 30 minutes further even if the charging current becomes lower than 150 mA before the timer runs out.

At the next step S46, the switch S4 and the voltage of each cell in the battery main unit 4 are checked, before control proceeds to a step S47. At the step S47, it is checked whether or not voltage differences between the cell voltages, that is voltage fluctuations, exceed 0.2 V. If the result of the decision is NO, control proceeds to a step S48. If the result is YES, control proceeds to a step S49.

At the step S48, after a stand-by period of, for example, 12 hours, control reverts to the step S41 which is the first step of the present background charging mode. This stand-by period corresponds to the period $P_D$, while the time period during which control reverts to the step S41 to effect the charging corresponds to the supplementary charging period $P_E$. This supplementary charging means the charging of eking out the spontaneous discharge. By automatically repeating the charging operation at an interval of 12 hours, an optimum charging voltage state may be maintained at all times.

At a step S49, since the voltage difference between the cell voltages is 0.2V or higher, the cell exhibiting the maximum voltage is discharged. When the equal voltage is reached, control reverts to the step S41 to re-initiate the charging. This realizes the function of achieving full charging while maintaining the optimum voltage balance among the cells of the battery main unit 4 (cell balance).

Figure 6:
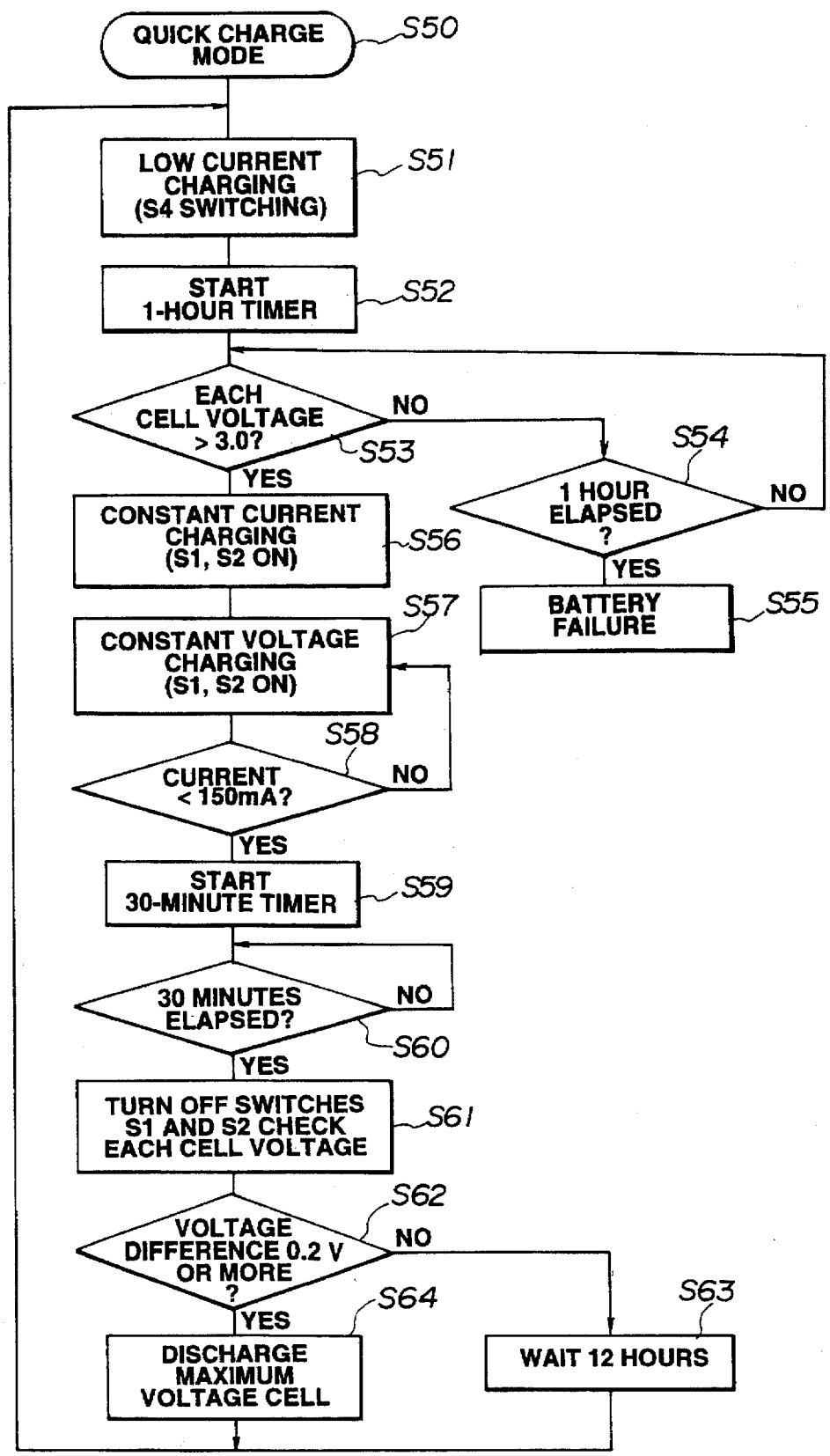
FIG. 6 is a flowchart for illustrating the background discharging mode among the charge/discharging control operations of the embodiment shown in FIGS. 1 and 2.
Figure 7:
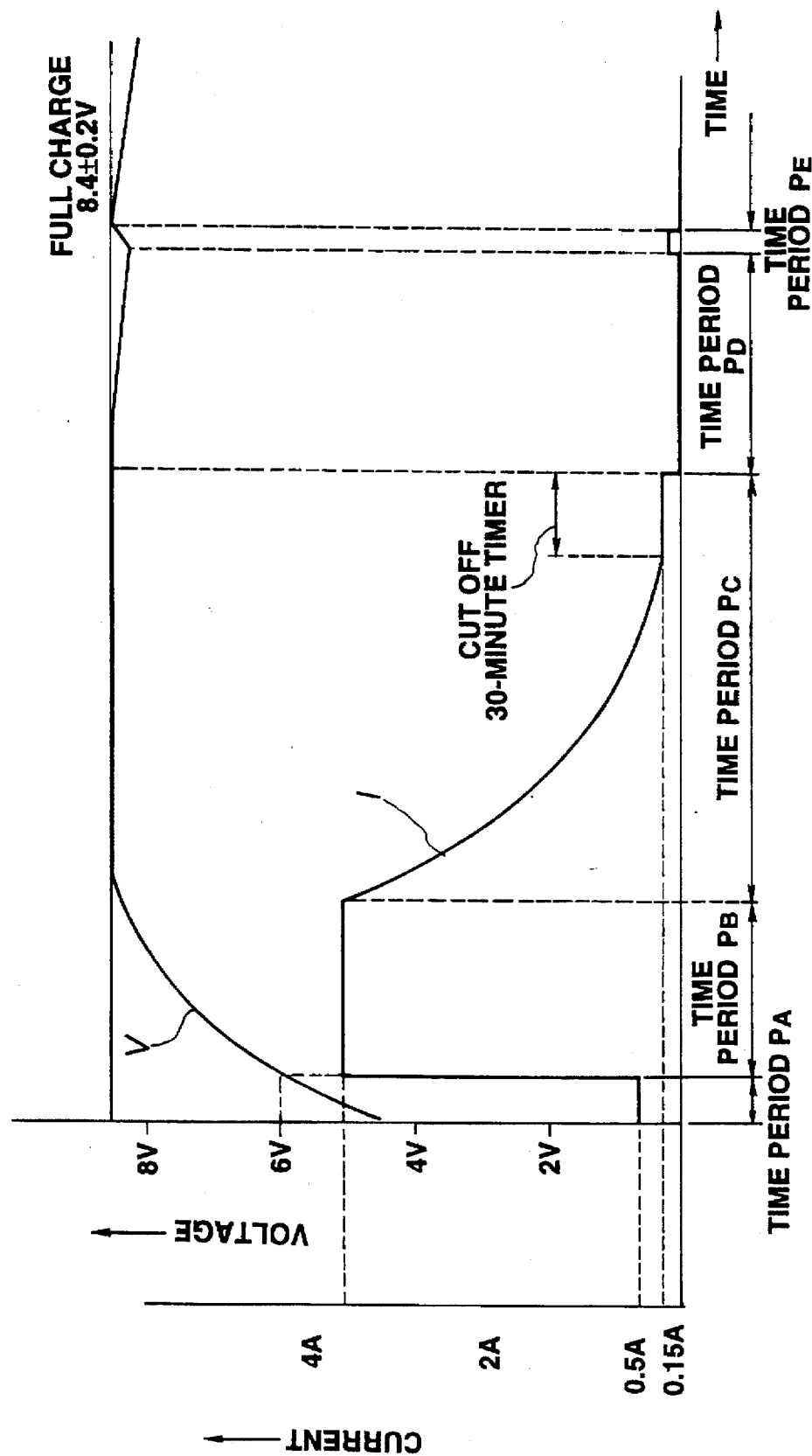
FIG. 7 is a graph showing changes in the current and the voltage with lapse of time in the quick charging mode.

The quick charge mode S50, which is established when the AC (power source)/PC (external equipment) state is decided to be such that the AC (power source) is on and the PC (external equipment) is off (S18), is explained by referring to the flowchart of FIG. 6 and the charging transition schema (charging process diagram) of FIG. 7.

The quick charging mode is the mode in which the battery main unit 4 of the battery pack 1 is charged when the external equipment 9 is turned off and the current from the power source circuit 10 is not supplied to the external equipment 9.

During this quick charging mode S50, the first stage period $P_A$ is the period during which the low current charging shown at a step S51 is performed. The low current charging is similar to the operation at the step S41 of the background charging mode, that is, the pre-set small current is caused to flow through the battery main unit 4 by switching the switch S4 at a pre-set frequency under control by the micro-computer (CPU) 11. This small current may for example be one-eighth of the usual charging current or about 0.5 A, and herein is equal to 0.5 A, while the switching frequency is on the order of, for example, 20 kHz.

The operation of the low current charging at the step of the quick charging mode S50 checks for possible unusualties of the battery main unit 4, such as short-circuiting or open-circuiting. The charging state of the battery main unit 4 is checked for each cell, in effect each group of the parallel-connected cells, making up the battery main unit 4. In more detail, it is checked if, during the low current charging for a pre-set time period, for example, for one hour, each cell reaches a pre-set voltage, such as 3.0 V, which is lower than the full-charge voltage of, for example, 4.2 V.

Specifically, a one-hour timer is started at a step S52 and it is checked at the next step S53 if each cell voltage is larger than 3.0 V. If the result of the decision is NO, control proceeds to a step S54 in order to determine if the time of one hour has elapsed. If the result of the step S54 is NO, control reverts to the step S53 and, if the result is YES, control proceeds to a step S55 to issue an alarm that the battery is in trouble. It is when there is one or more cells in which the voltage of 3.0 V is not reached after low current charging for one hour that control proceeds to the step S55. The quick charging mode is terminated, if so required, after issuing an alarm to the effect that the battery is in trouble, as mentioned above.

When the result of the decision at the step S43 is YES, that is if each cell voltage exceeds 0.3 V, control proceeds to a step S56 in order to carry out a constant current charging for the period $P_B$ as a second step of the quick charging mode S50. During this constant current charging, the switches S1 and S2 are turned on and the cells of the battery main unit 4, more specifically, each group of the parallel-connected cells, are charged at a pre-set current, for example, at the current of 4 A. At this time, the charging voltage of the battery main unit 4 is increased rapidly. When a voltage close to the full charging voltage, such as 8.2 V, is reached, the charging period proceeds to the next third period $P_C$ at a step S57 and the constant voltage charging is carried out. This constant voltage charging is carried out under substantially a constant voltage of from e.g. 8.2 V up to the full charging voltage of 8.4V±0.2V.

If, as a result of the constant voltage charging, the charging current is found at a step S58 to be smaller than, for example, 150 mA, control proceeds to a step S59 to cause e.g. a 30-minute timer to be started. It is checked at a step S60 if the time period of 30 minutes has elapsed. If the result is YES, control proceeds to the next step S61. This 30-minute charging is termed a charging for assurance. That is, charging is continued for 30 minutes further even if the charging current becomes lower than 150 mA before the timer runs out.

At the next step S61, the switches S1 and S2 are turned off and the cell voltages in the battery main unit 4 are checked before control proceeds to a step S62. At the step S62, it is checked whether or not voltage differences between the cell voltages, that is voltage fluctuations, exceed 0.2 V. If the result of the decision is NO, control proceeds to a step S63. If the result is YES, control proceeds to a step S64.

At the step S63, after a stand-by period of, for example, 12 hours, control reverts to the step S51 which is the first step of the present background charging mode. This stand-by period corresponds to the period $P_D$, while the time period during which control reverts to the step S51 to effect the charging corresponds to the supplementary charging period $P_E$. This supplementary charging means the charging of eking out the spontaneous discharge. By automatically repeating the charging operation at an interval of 12 hours, an optimum charging voltage state may be maintained at all times.

At a step S64, since the voltage difference between the cell voltages is 0.2V or higher, the cell exhibiting the maximum voltage is discharged. When the equal voltage is reached, control reverts to the step S51 to re-initiate the charging. This realizes the function of achieving full charging while maintaining the optimum voltage balance among the cells of the battery main unit 4 (cell balance).

During the period of the stand-by state following the end of the background charging or quick charging, such as the period $P_D$ shown in FIGS. 5 and 7, the switch S2 for charging is turned on. Thus, even if the power source circuit 10 is abruptly turned off, the discharge current may be supplied to the external equipment 9 via the switch S2 and the diode D3 instantly, that is without relying on the decision given at the micro-computer 11, in order to prevent the occurrence of inconveniences caused by power down, such as data destruction.

With the above-described battery pack, the control circuit, so far provided in the charger or the external equipment, is provided in the battery pack for simplifying the charger or the external equipment and reducing the size and the cost of the battery pack.

As for the operation of the control circuit, the charging and discharging operations are performed based upon the charging transition diagram or the charging process diagram, so that the charging and discharging operations matched to the characteristics of the secondary battery in the battery pack may be carried out and hence the charging voltage in each cell may be perpetually maintained in the normal state.

Besides, since the charging and discharging states may be detected from one cell to another, the cell states can be detected quickly, and hence the unusual states, such as the unbalanced state, excessive charged state or the excessive discharged state, can be detected quickly and easily.

In addition, since the battery pack now has the function of detecting the input voltage from the charger, it becomes possible for the battery pack to detect the voltage other than the charging voltage of the battery pack in order to prevent destruction of the cells making up the secondary battery of the battery pack.

During the above-described charge/discharge operations, inclusive of the above-mentioned wait mode, as explained in connection with FIGS. 3 to 7, the charging and discharging operations of the battery main unit 4 are perpetually monitored by the micro-computer 11 and the analog circuit 12 of FIG. 2. The information on the states within the battery pack 1 during the charging and discharging operations and the inquiries from the external equipment 9 are exchanged via the external control terminal 8 between the micro-computer 11 and the external equipment 9. The function of the exchange of the information (communication) is hereinafter explained.

The communication via the external control terminal 8 of the battery pack 1 of the present embodiment is by the asynchronous full duplex communication system, with transmitted data having the error check function and being based on eight bits as a unit. The start and stop bits are each one bit and the X-ON/X-OFF functions operate as handshaking. The standard for the communication may be changed if required.

Specific examples of data transmitted from the external equipment 9, such as a personal computer, to the micro-computer 11 in the battery pack 1 include the operational (OP) codes as shown in the following Table 1:

TABLE 1

|  | queries of intrinsic information | queries of statuses | commands | declaration | |
| --- | --- | --- | --- | --- | --- |
|  |  |  | upper |  |  |
| lower 0 | 1 | 2 | 3 | 4 | ... F |
| 0 | model No. | full capactiy | restart | wake up | . . |
| 1 | version | get capacity | set thresh 1 | suspend | . . |
| 2 | cell conf. | get voltage | set thresh 2 | charge | . . |
| 3 | type | get current | set thresh 3 | discharge |  |
| 4 | vender |  | set thresh 4 | sync |  |
| 5 |  |  | set thresh 5 | async |  |
| 6 |  |  | set thresh 6 |  |  |
| 7 |  |  | set thresh 7 |  |  |
| 8 |  |  | set thresh 8 |  |  |
| 9 |  |  | set thresh 9 |  |  |
| A |  |  | set thresh 10 |  |  |
| B |  |  |  |  |  |
| C |  | get volt. cell 1 |  |  |  |
| D |  | get volt. cell 2 |  |  |  |
| E |  | get volt. cell 3 |  |  | ... Repeat |
| F |  | get volt. cell 4 |  | suspend current | ... acknowledge |

In the OP codes, shown in Table 1, upper and lower four bits of each 8-bit word are represented by the hexadecimal notation. The contents of the communication are roughly classified into at least four kinds of the communication which are the intrinsic information inquiry, status inquiry, command and the declaration. Table 1 also gives examples of the OP codes for re-inquiry and acknowledgement.

Among items of the intrinsic information inquiry, there are, for example, those OP codes used for inquiring into the model numbers (Model Nos) specific to the battery pack, version, cell configuration, type and the venders. Among items of the status inquiry, there are those OP codes used for inquiring into the maximum capacity (Full Capacity), current capacity (Get Capacity), the number of times of charging (Get Cycle Nos), the present capacity (Get Voltage) or the present current (Get Current) and those OP codes used for inquiring into the cell voltages (Get Volt. Cell 1 etc). Among items of the command, there are OP codes used for re-starting the micro-computer 11 or setting various threshold voltages for alarms concerning excessive discharge (Set Thresh 1 etc). Among items of the declaration, there are those OP codes used for setting the state of the battery pack 1 from the external equipment 9, such as sync and async.

In the above Table 1, specific examples of allocation of the OP codes to the portion of 256 8-bit words in which upper four bits are 1h to 4h, where h indicates that the number is hexadecimal, and also specific examples of allocation of the OP codes of re-inquiry (repeat) and acknowledgement (acknowledge) to FEh and FFh. Any optional OP codes may also be allocated to the portion other than the above-defined portion. Specifically, the OP codes shown in Table 1 are those used by the user when communicating with the battery pack 1 via the external equipment 9. In addition, the OP codes for the maker to conduct adjustments and testing of the battery pack 1 may be allocated to the portion of the 256 words having the upper four bits of 8h to Ah.

Specific examples of the data codes transmitted from the micro-computer 11 within the battery pack 1 to the external equipment 9 such as the personal computer responsive to the OP codes transmitted from outside into the battery pack 1 are shown in Table 2.

and F3h, respectively, the notification that the battery is in trouble (Battery Failure) is allocated to F4h and the notification that the battery has reached its end (End of Battery) is allocated to F5h. These notifications are issued in synchronism with the inquiry timing from the external equipment 9. However, if the state of the micro-computer 11 is rendered asynchronous (Async) by the OP code for the declaration for asynchroneity (44h) having been transmitted from the external equipment 9, the above notifications may also be sent asynchronously, that is without regard to the inquiries from the external equipment 9. The request for retransmission (Resend) and the notification that the transmission data is invalid or out of standard (Illegal) are allocated to F6h and F7h, respectively, while the acknowledgement that data has been received from the external equipment 9 (Acknowledge) is allocated to FFh.

Among the above three voltage threshold values, Low Battery 0, Low Battery 1 and Low Battery 2 correspond to a voltage for which restart becomes impossible on power off, a voltage instructing the transfer of the memory information of the external equipment 9 to a hard disc or the like and a voltage instruction of the termination of transfer of the memory information of the external equipment 9 to the hard disc or the like, respectively.

A specific example of the communication between the external equipment 9, such as a personal computer, and the micro-computer 11 in the battery pack 1, is hereinafter explained.

If 10h is sent from the external equipment 9 (host side) as an OP code inquiring as to the model number of the battery pack (Model No), the data code of 0Ah ($10_{10}$) is returned back from the micro-computer 11 of the battery pack 1. The external equipment 9 (host side), which has pre-registered therein the model number of the connectable battery pack, decides whether or not the returned battery pack number is appropriate. If the returned battery pack number is found to

TABLE 2

| lower | \multicolumn{16}{c}{upper} | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | A | B | C | D | E | F |
| 0 | 0 | 16 | 32 | 48 | 64 | 80 | 96 | 112 | 128 | 144 | 160 | 176 | 192 | 208 | 224 | good morning (async) |
| 1 | 1 | 17 | 33 | 49 | 65 | 81 | 97 | 113 | 129 | 145 | 161 | 177 | 193 | 209 | 225 | low battery 0 (async) |
| 2 | 2 | 18 | 34 | 50 | 66 | 82 | 98 | 114 | 130 | 146 | 162 | 178 | 194 | 210 | 226 | low battery 1 (async) |
| 3 | 3 | 19 | 35 | 51 | 67 | 83 | 99 | 115 | 131 | 146 | 163 | 179 | 195 | 211 | 227 | low battery 2 (async) |
| 4 | 4 | 20 | 36 | 52 | 68 | 84 | 100 | 116 | 132 | 147 | 164 | 180 | 196 | 212 | 228 | battery failure (async) |
| 5 | 5 | 21 | 37 | 53 | 69 | 85 | 101 | 117 | 133 | 148 | 165 | 181 | 197 | 213 | 229 | end of battery (async) |
| 6 | 6 | 22 | 38 | 54 | 70 | 86 | 102 | 118 | 134 | 149 | 166 | 182 | 198 | 214 | 230 | resend |
| 7 | 7 | 23 | 39 | 55 | 71 | 87 | 103 | 119 | 135 | 150 | 167 | 183 | 199 | 215 | 231 | illegal |
| 8 | 8 | 24 | 40 | 56 | 72 | 88 | 104 | 120 | 136 | 151 | 168 | 184 | 200 | 216 | 232 | |
| 9 | 9 | 25 | 41 | 57 | 73 | 89 | 105 | 121 | 137 | 152 | 169 | 185 | 201 | 217 | 233 | |
| A | 10 | 26 | 42 | 58 | 74 | 90 | 106 | 122 | 138 | 153 | 170 | 186 | 202 | 218 | 234 | |
| B | 11 | 27 | 43 | 59 | 75 | 91 | 107 | 123 | 139 | 154 | 171 | 187 | 203 | 219 | 235 | |
| C | 12 | 28 | 44 | 60 | 76 | 92 | 108 | 124 | 140 | 155 | 172 | 188 | 204 | 220 | 236 | |
| D | 13 | 29 | 45 | 61 | 77 | 93 | 109 | 125 | 141 | 156 | 173 | 189 | 205 | 221 | 237 | |
| E | 14 | 30 | 46 | 62 | 78 | 94 | 110 | 126 | 142 | 157 | 174 | 190 | 206 | 222 | 238 | |
| F | 15 | 31 | 47 | 63 | 79 | 95 | 111 | 127 | 143 | 158 | 175 | 191 | 207 | 223 | 239 | acknowledge |

Referring to Table 2, the words 00h to EFh, where h indicates that the number is the hexadecimal number, represent the corresponding values of 0 to 239 of the decimal number ($10_{10}$ and $239_{10}$). The fixed contents of the communication are allocated to the codes F0h to FFh. For example, salutation on starting the micro-computer (Good Morning) is allocated to F0h, the notification that the three low-voltage threshold values have been reached (low battery 0, low battery 1 and low battery 2) are allocated to F1h, F2h be not appropriate, control proceeds to the operation of indication of the battery failure or termination of the charge/discharge operation. In giving the decision as to appropriateness (connectibility), the version, cell configuration, type or the vender may be used as conditions.

The setting of the discharge cessation threshold voltage may be selected depending on the power consumed by the external equipment. That is, the setting as to the three kinds of the voltage threshold values may be selected by transmitting any one of the setting commands of the threshold voltages 31h to 3Ah as the OP codes from the external equipment 9 (host side) to the micro-computer 11 of the battery pack 1. The ten sets of each of the three kinds of the voltage threshold values are previously set in association with the ten threshold voltage setting commands. It is up to the external equipment 9 to select a desired one of the sets of the threshold voltages.

As for the maximum capacity (Full Capacity), current capacity (Get Capacity), number of times of charging (Get Cycle No), present voltage (Get Voltage), present current (Get Current) and voltages of respective cells (Get Volt. Cell 1), as the OP codes of the status queries, the respective OP codes are transmitted from the external equipment 9 (host side) to the micro-computer 11 of the battery pack 1, so that respective values are returned from the micro-computer 11 to the external equipment 9. The capacities of the battery main unit 4 (maximum capacity and the present capacity) are calculated to a high accuracy using the current, voltage, temperature and the inner resistance.

Besides, queries or settings are made from the external equipment 9 (host side) to the battery pack 1 and a variety of control operations are executed based upon judgements given on the responses accordingly made from the battery pack 1.

Figure 8:
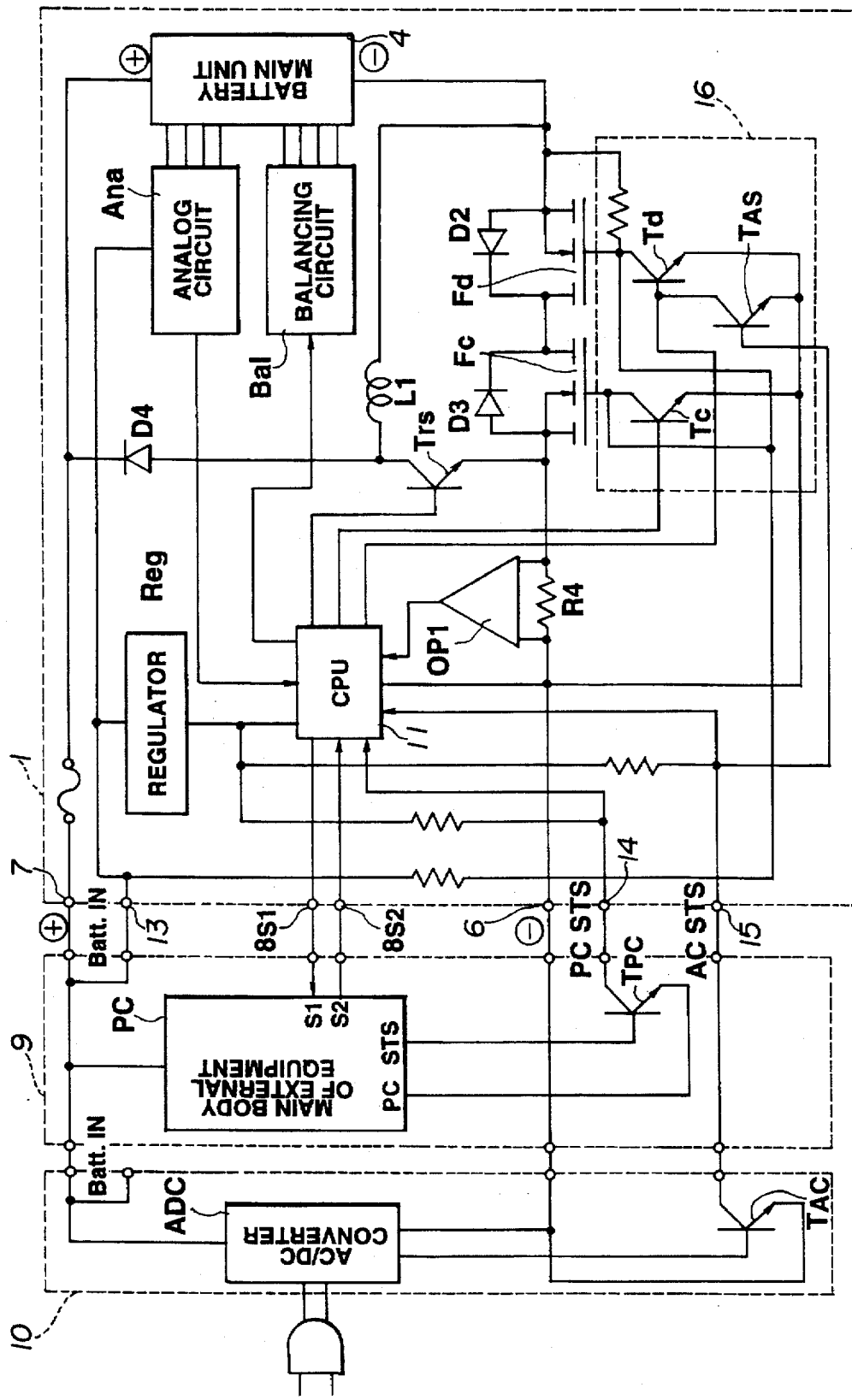
FIG. 8 is a schematic block circuit diagram showing, along with a peripheral circuit, the structure of a circuit of a modification of the battery pack according to the present invention.

FIG. 8 shows, in a block circuit diagram, a circuit of the battery pack according to a second embodiment of the present invention, and its peripheral circuit.

Referring to FIG. 8, an analog circuit Ana is equivalent to the analog circuit 12 of the embodiment shown in FIG. 2, while FETs (field effect transistors) Fc and Fd are equivalent to the switches S1 and S2 of FIG. 2 and a transistor Trs is equivalent to the switch S4 in FIG. 2. The parts of FIG. 8 equivalent to those shown in FIG. 2 are indicated by the same reference numerals and the corresponding description is omitted or simplified for clarity.

In the embodiment of FIG. 8, the connection terminals of the battery pack 1 include, in addition to a negative terminal 6, a positive terminal 7 and an external control terminal 8 (an output terminal $8_{s1}$ and an input terminal $8_{s2}$ in FIG. 8), which are similar to those shown in FIG. 2, a battery-in (Batt. IN) terminal 13, PC status (status of the external equipment PC STS) input terminal 14 and an AC status (power source status, AC STS) input terminal 15.

The battery-in (Batt. IN) terminal 13 is used on loading the battery pack 1 in order to supply the power from the power source to the circuitry in the battery pack 1 through an external connection equipment in addition to supplying the power through a power source line in the battery main unit 4. To this end, the battery-in (Batt. IN) terminals of the external equipment 9 and the power source circuit 10 are connected to the positive side power source lines within the external equipment 9 and the power source circuit 10, respectively. With this constitution, if the negative terminal 6 or the positive terminal 7 of the battery pack 1 are shorted from outside or are connected to the illicit power source terminals, the circuitry within the battery pack 1 is not actuated, so that no ill effects are produced.

Within the external equipment 9, there are provided a main body of the external equipment PC, such as a personal computer, and a transistor $T_{AC}$ which is turned on when the main body of the external equipment PC is turned on. The PC status information PC STS from the transistor $T_{PC}$ and the AC status information AC STS from the transistor $T_{AC}$ are transmitted to the micro-computer (CPU) 11 via the PC status terminal 14 and via the AC status terminal 15 of the battery pack 1, respectively.

Within the battery pack 1, a regulator (voltage stabilization circuit) Reg and the analog circuit Ana are connected to the battery-in (Batt. IN) terminal 13 for supplying the power thereto. The battery-in terminal 13 is also connected to the gates of the FETs Fc and Fd via a resistor and a switch control circuit 16. In this manner, when the battery pack is loaded in position, the FETs Fc and Fd are both turned on, so that the power may be supplied from the negative terminal of the battery main body 1 to the negative terminal 6 of the battery pack 1 even if the AC/DC converter ADC of the power source circuit 10 is turned off. The stabilized voltage output of the regulator Reg is supplied to the CPU 11. The analog circuit Ana detects the voltage for each cell of the battery main unit 4 and transmits the detected voltage to the CPU 11.

The PC status (status of the external equipment PD STS) from the input terminal 14 and the AC status (status of the power source AC STS) from the input terminal 15 are transmitted to the CPU 11 where the AC PC status detection as in step S13 of the flowchart of FIG. 3 is performed. Depending on the detected AC PC status, any one of the wait mode operation, discharge mode operation, background mode operation and the quick charge mode operation is executed.

During execution of these modes, the CPU 11 executes calculations based upon the cell voltage values from the analog circuit Ana, charging/discharging current values from the operational amplifier OP1 and the temperature from a temperature sensor in order to find a voltage for a given current value as calculated from the current actual voltage value or find the data such as residual capacity or the maximum capacity. Besides, the CPU 11 transmits necessary data responsive to the inquiries made from the external equipment 9. It is noted that the voltage for a pre-set constant voltage is found as described above in view that a voltage value for larger current values is low and, if such voltage value is directly used for condition discrimination, it is likely that there results a mistaken decision. Also, since the present detected voltage is changed with temperatures, it should be corrected in consideration of temperature characteristics. Besides, it may also be contemplated to correct the residual voltage or the maximum capacity depending on the current or the temperature.

As described in connection with the steps S47 and S49 or S62 and S64 of the flowcharts of FIGS. 4 and 6, the balancing circuit Bal discharges the cell exhibiting the maximum voltage when the difference between the cell voltages exceeds 0.2 V in order to equalize the cell voltages and in order to establish the voltage balance from cell to cell. To this end, the CPU 11 discriminates the cell voltages as detected by the analog circuit Ana and controls the balancing circuit Bal when the voltage difference exceeds 0.2 V to turn on one of the discharge switches of the cells showing the maximum voltage.

Each of the FETs Fc and Fd, which are charge/discharge control switches, has its gate voltage controlled by the switch control circuit 16 so as to be turned on or off. That is, the FET Fc has its gate connected to the collector of the transistor Tc, while the FET Fd has its gate connected to the collector of the transistor Td, and a control signal from the CPU 11 is supplied to the bases of these transistors Tc and Td. The transistor Td has its base connected to the collector of a transistor $T_{AS}$, the base of which is connected to the AC status input terminal 15.

Also, as described above, the battery-in terminal 13 is connected via a resistor to the gates of the FETs Fc and Fd, so that these FETs Fc and Fd are controlled responsive to the loading of the battery pack 1, that is responsive to the voltage application to the battery-in terminal 13.

If, when the battery pack 1 is loaded in position, the transistors Tc and Td are turned off and the FETs Fc and Fd are both turned on, such that, if the transistors Tc and Td are turned on responsive to the control signal from the CPU 11, the FET connected to the transistor which has been turned on is turned off. It may also occur that, if both the transistors Tc and Td are turned on, both the FETs Fc and Fd are turned off.

The transistor $T_{AS}$ within the switch control circuit 16 is turned on and off depending on the voltage at the AC status input terminal 15. That is, if the power source circuit 10 is turned on, the transistor $T_{AS}$ within the power source circuit 10 is turned on, so that the voltage at the terminal 15 is at a low (L) level. The transistor Td is turned on and off depending on the control signal from the CPU 11. Conversely, if the power source circuit 10 is turned off or disconnected, the voltage at the AC status input terminal 15 becomes high (H). Thus the transistor $T_{AS}$ is turned on so that the base of the transistor Td is forced to be at a low level and hence FET Fd is turned on.

That is, if, during the above-mentioned background charging mode, with the AC (power source) being turned on, the PC (external equipment) being turned off, the FET Fd or the transistor Trs being turned off, and the electrical connection of the power source circuit 10 being interrupted, the power source of the external equipment 9, such as the personal computer 9, is interrupted temporarily, data destruction or the like inconvenience may be produced. In this consideration, the transistor $T_{AS}$ is directly turned on by an analog technique for instantaneously turning the FET Fd on without waiting for the decision as to the AC status to be given by the CPU 11. In other words, If the FET Fd is turned on based upon the decision given by the CPU 11, the time lag corresponding to the execution of the discrimination program is produced and a delay is caused in the power supply from the battery main unit 4 to the external equipment 9, so that there is the risk of power supply interruption if for a shorter period of time. With the arrangement of FIG. 8, the FET Fd is turned on simultaneously with a change in the AC status, that is with the minimum delay on the order of the transistor switching time, for supplying the power instantly from the battery main unit 4 to the external equipment 9 in order to prevent data destruction or the like inconvenience from occurring.

Although the FETs Fc and Fd, which are switches for controlling the charging/discharging, are connected in the above embodiment to the negative side power source line, they may also be connected to the positive side power source line. The arrangement of the switch controlling circuit 16 may be configured in a manner different from that shown in the drawings. Alternatively, the switch control circuit 16 may be omitted so that the FETs Fc and Fd may be turned on and off based upon a control signal supplied from the CPU 11. In addition, the negative terminal of the CPU 11 may also be connected to the negative terminal of the battery main unit 4.

A further modification of the battery pack according to the present invention is hereinafter explained.

In the present modification, the arrangement shown in FIG. 2 or the arrangement shown in FIG. 8 is employed as the internal arrangement of the battery pack. The communication function performed in the present embodiment with the aid of the external control terminal 8 is achieved by the asynchronous full duplex communication system. The data transmitted is based on eight bits as a unit and has an error check function. The start bit and the stop bit are both one bit. For handshaking, the x-ON/x-OFF function comes into play. The communication means may, however, be modified as desired.

The data format for communication between the external equipment 9 and the micro-computer 11 is by the so-called polling system.

According to the polling system, the polling codes, the normal data command codes and the error command codes in use comprise 256 codes formed by 4 LSB side bits and 4 MSB side bits, as shown in Table 3. The codes entered in Table 3 are represented by abbreviations elucidated in Tables 4 to 7.

TABLE 3

| | | | | | | | MSB | | | | | | | | | |
|---|---|---|---|---|---|---|---|---|---|---|---|---|---|---|---|---|
| | | 0 | 1 | 2 | 3 | 4 | 5 | 6 | 7 | 8 | 9 | A | B | C | D | E | F |
| | 0 | BID | BVA | BVB | KWS | CV1 | CV1 | CV2 | CV2 | CV3 | CV3 | CV4 | CV4 | CCM | | ER1 | ODC |
| | 1 | KWS | BVA | BVB | KWS | CV1 | CV1 | CV2 | CV2 | CV3 | CV3 | CV4 | CV4 | DCM | | ER2 | CTO |
| | 2 | CPS | BVA | BVB | KWS | CV1 | CV1 | CV2 | CV2 | CV3 | CV3 | CV4 | CV4 | BCM | | | AFL |
| | 3 | ECK | BVA | BVB | KWS | CV1 | CV1 | CV2 | CV2 | CV3 | CV3 | CV4 | CV4 | | | | CNG |
| | 4 | CC1 | BVA | BVB | KWS | CV1 | CV1 | CV2 | CV2 | CV3 | CV3 | CV4 | CV4 | COK | | | CNG |
| | 5 | CC2 | BVA | BVB | | CV1 | CV1 | CV2 | CV2 | CV3 | CV3 | CV4 | CV4 | CNG | | | CNG |
| | 6 | CC3 | BVA | BVP | | CV1 | CV1 | CV2 | CV2 | CV3 | CV3 | CV4 | CV4 | | | | CNG |
| | 7 | CC4 | BVA | BVB | | CV1 | CV1 | CV2 | CV2 | CV3 | CV3 | CV4 | CV4 | | | | CNG |
| | 8 | CC5 | BVA | BVB | | CV1 | CV1 | CV2 | CV2 | CV3 | CV3 | CV4 | CV4 | | | | |
| | 9 | | BVA | BVB | | CV1 | CV1 | CV2 | CV2 | CV3 | CV3 | CV4 | CV4 | | | | |
| | A | | BVA | BVB | | CV1 | CV1 | CV2 | CV2 | CV3 | CV3 | CV4 | CV4 | | | | |
| | B | | BVA | BVB | | CV1 | CV1 | CV2 | CV2 | CV3 | CV3 | CV4 | CV4 | | | | |
| | C | | BVA | BVB | | CV1 | CV1 | CV2 | CV2 | CV3 | CV3 | CV4 | CV4 | | | | |
| | D | | BVA | BVB | | CV1 | CV1 | CV2 | CV2 | CV3 | CV3 | CV4 | CV4 | | | | |
| | E | | BVA | BVB | | CV1 | CV1 | CV2 | CV2 | CV3 | CV3 | CV4 | CV4 | | | | |
| | F | | BVA | BVB | | CV1 | CV1 | CV2 | CV2 | CV3 | CV3 | CV4 | CV4 | | | | EOK |

TABLE 4

| polling codes | | |
|---|---|---|
| codes | contents | abbreviations |
| 00 | | |
| 01 | battery ID | BID |

TABLE 4-continued polling codes

| codes | contents | abbreviations |
|---|---|---|
| 02 | kind of W/S | KWS |
| 03 | charge power supply | CPS |
| 04 | error check | ECK |
| 05 | cell(1) capacity | CC1 |
| 06 | cell(2) capacity | CC2 |
| 07 | cell(3) capacity | CC3 |
| 08 | cell(4) capacity | CC4 |
| 09 | cell(5) capacity | CC5 |

TABLE 5 normal message codes

| codes | contents | abbreviations |
|---|---|---|
| 10 | battery pack version (A) | BVA |
| 1F | 16 | |
| 20 | battery pack version (B) | BVB |
| 2F | 16 | |
| 30 | kind of W/S | |
| 35 | 16 | |
| 40 | 1.4 V (bellen 1.4 V) | CV1 |
| 41 | 1.5 V cell voltage | |
| 42 | 1.6 V check (1) | |
| 5E | 4.4 V | |
| 5F | 4.5 V | |
| 60 | 1.4 V (bellen 1.4 V) | CV2 |
| 61 | 1.5 V cell voltage | |
| 62 | 1.6 V check (2) | |
| 7E | 4.4 V | |
| 7F | 4.5 V | |
| 80 | 1.4 V (bellen 1.4 V) | CV3 |
| 81 | 1.5 V cell voltage | |
| 82 | 1.6 V check (3) | |
| 9E | 4.4 V | |
| 9F | 4.5 V | |
| A0 | 1.4 V (bellen 1.4 V) | CV4 |
| A1 | 1.5 V cell voltage | |
| A2 | 1.6 V check (4) | |
| BE | 4.4 V | |
| BF | 4.5 V | |

TABLE 6 normal message codes

| code | contents | abbreviations |
|---|---|---|
| C0 | charge mode | CCM |
| C1 | discharge mode | DCM |
| C2 | back charge mode | |
| C3 | charge power | |
| C5 | OK | COK |
| C6 | NG | CNG |
| E0 | error mode 1 | ER1 |
| E1 | error mode 2 | ER2 |

TABLE 7 error message codes

| code | contents | abbreviations |
|---|---|---|
| F0 | over discharge caution | ODC |
| F1 | current time over | CTO |

TABLE 7-continued error message codes

| code | contents | abbreviations |
|---|---|---|
| F2 | another failure | AFL |
| F3 | cell NG indication | CNG |
| F4 | cell NG indication | |
| F5 | cell NG indication | |
| F7 | cell NG indication | |
| FF | failure mode power off OK | EOK |

Usually, the polling codes (00h to 0Eh) are transmitted from the external equipment 9 (host side) to the micro-computer 11 (battery side), where h indicates that the number is represented in hexadecimal notation.

Responsive to the polling codes (00h to 0Eh) from the external equipment 9, the micro-computer 11 sends two bytes (DATA 1 and DATA 2) of normal message codes (10h to EFh, 10h to EFh), so that the external equipment 9 and the micro-computer 11 monitor the states of each other at a pre-set time interval at all times.

If the micro-computer 11 (battery side) falls into an unusual state, error message codes (F0h to FFh) are transmitted in place of the normal message codes (10h to EFh) in order to apprise the external equipment 9 of the unusual state of the micro-computer 11 (battery side). The external equipment 9 (host side) returns back the polling code (FFh) for transmitting the signal indicating the power off OK.

The polling code (00h to 0Eh), the normal message code (10h to EFh) and the error message codes (F0h to FFh) are shown in Tables 4 to 7 and detailed explanation therefor is not made.

Among the control by the external equipment 9 by the function of communication and the control by the micro-computer 11 by the function of communication in the present modification, the control by the external equipment 9 is roughly divided into the following four kinds of the control operations.

These control operations include (1) acknowledgement of the battery identification (ID), that is the polling code 01h, (2) acknowledgement of the battery version (polling code 02h), (3) battery capacity (polling codes 15h to 19h) and (4) computer troubles.

Among the error messages during polling, there are those for over-discharge (excessive discharge state) in the battery main unit 4 and troubles in the battery main unit 4, such as open-circuiting or short-circuiting. The external equipment 9 (host side) receiving these error codes is prepared for power-off or proceeds to power-off.

Figure 9:
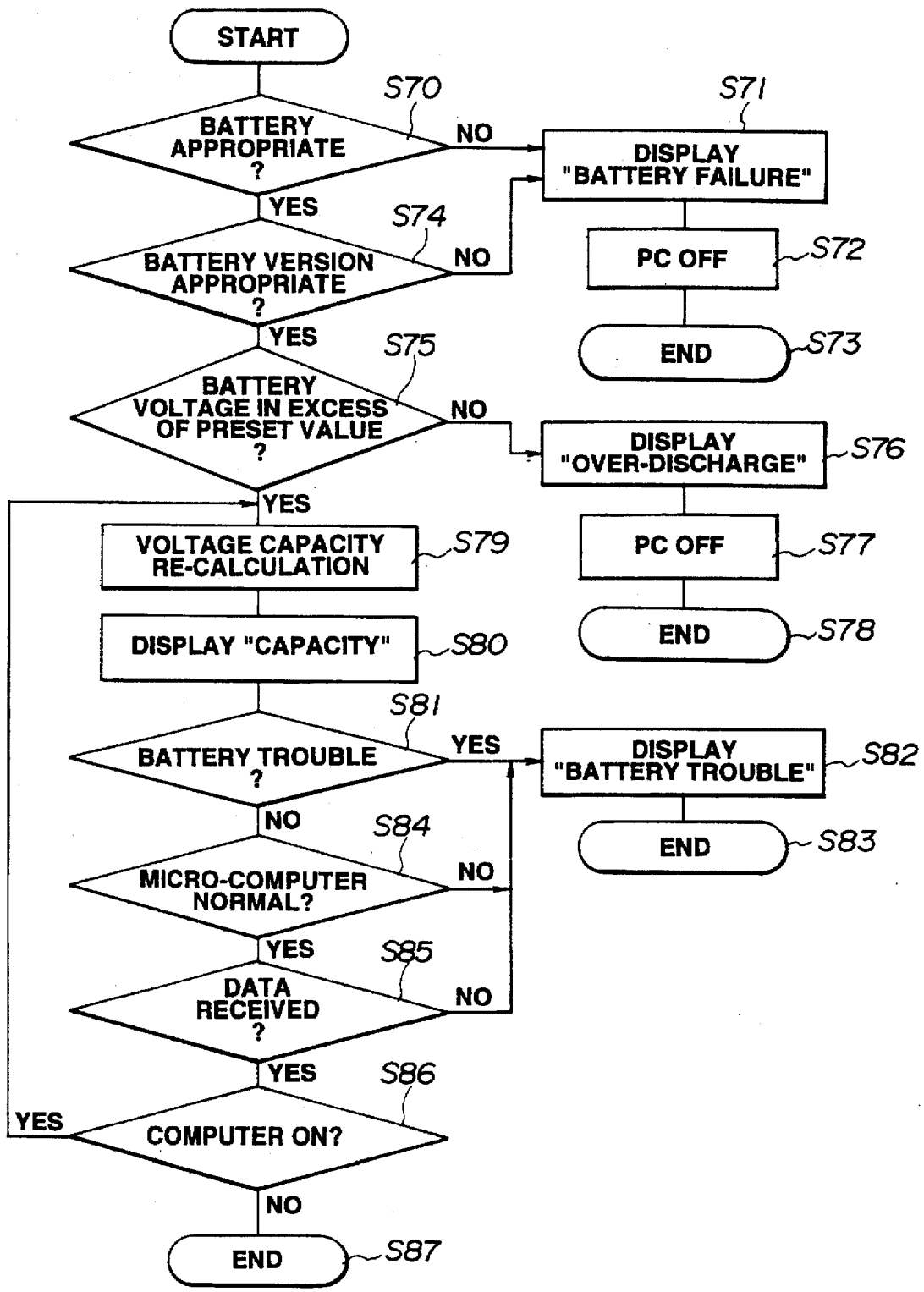
FIG. 9 is a flowchart for illustrating the operation of a further modification of the battery pack according to the present invention.

The polling codes from the external equipment 9 (host side) and the communication from the micro-computer 11 (battery side) are explained by referring to the flowchart shown in FIG. 9.

The external equipment 9 (host side) first sends a polling code (01h) to the micro-computer 11 (battery side) in order to check in advance whether or not the battery ID is adapted to the external equipment 9.

The battery ID is previously registered both in the external equipment 9 and in the micro-computer 11 of the battery main unit 4 loaded on the battery pack 1.

Consequently, by providing plural battery IDs in advance, it is possible for the external equipment 9 (host side) to make the discrimination of the loaded battery pack 1 by comparison with the battery ID as read out from the micro-computer 11 of the battery pack 1.

In the case of non-matching of the battery ID, an indication "battery failure" is made and the external equipment 9 (PC) is turned off to terminate the charging/discharging operations by the steps of S70 through to the step S73.

If the battery ID is found to be adapted to the external equipment 9, the micro-computer 11 (battery side) sends out a response of acknowledgement (FFh).

If the battery version is not correct, that is if it has an old version number, the charged state of the battery main unit 4 lacks reliability. Thus the indication of "battery failure" is made and the external equipment 9 (PC) is turned off to terminate the discharging operation from the micro-computer 11 by the steps of S74, S71, S72 and S73 in this order.

If the battery version is adapted to the version previously set on the external equipment 9, inspection is then made of the charging voltages of the cell groups making up the battery main unit 4.

That is, it is detected whether or not the charging voltage state of the battery main unit 4 is not less than a pre-set value. In addition, detection is made of the charging voltages of the cells making up the battery main unit 4.

That is, the inspection of the voltage states of the cells may be made by sending out the polling codes (05h, 06h, 07h, 08h and 09h) shown in Table 4, in response to which the voltage states of the cells associated with the polling codes are returned back from the micro-computer 11 (battery side).

More specifically, the micro-computer 11, receiving these polling codes (05h, 06h, 07h, 08h and 09h), instructs the analog circuit 12 to inspect the voltage states of the cells making up the battery main unit 4. The analog circuit 12 then detects the voltage states of the cells making up the battery main unit 4, with the detected voltage states being fed back to the micro-computer 11. It is also possible to get the information of the cells held in advance in the micro-computer 11 via the analog circuit 12.

If the voltage states of the cells of the battery main unit 4 thus fed back are normal, for example, if the polling code is 05h or 06H, normal data command codes 40h to 5Fh or normal data command code 60h to 7Fh are returned, respectively.

If the cells are unusual, error command codes F3h to F7h shown in FIG. 7 are returned. For example, the error codes F3h or F4h are returned for the polling codes 05h or 06h, respectively.

Consequently, should the error command codes F3h to F7h be returned from the micro-computer 11 (battery side) responsive to the polling codes 05h to 09h, respectively, the "over-discharge" state is displayed by an associated transistor and the external equipment 9 is turned off to terminate the discharge from the battery pack 1 by the steps S75 through to the step S78.

If the charged voltages of the cells are normal responsive to the polling codes 05h to 09h, the charging voltage of the battery main unit 4 is calculated by voltage capacity calculation in order to display the "capacity" by the steps S75, S79 and S80 in this order.

The battery states can be detected in the present embodiment by polling at an interval of approximately one second.

The polling code 04h is transmitted to the micro-computer 11 (battery side) to make an error check. If there is a battery failure, an error code (F0h to F7h) is sent out to the external equipment 9, and the discharge from the battery pack 1 is terminated.

The troubles for which the indication "battery failure" is made include (1) excessive discharged state of the battery main unit 4 (code F0h), (2) the charging states in the charging mode, discharge mode and in the background charging mode not delineating a normal curve at the respective stages (during the above-mentioned time periods $P_A$, $P_B$, $P_C$ and $P_D$) as shown in FIGS. 5 and 7, (3) the battery main unit 4 being short-circuited, (4) the battery main unit 4 being open-circuited, (5) no response being made from the battery main unit 4 (hang-up state), and (6) the cells of the battery main unit 4 having been detected to be unusual.

These troubles are detected in the present embodiment by polling at an interval of approximately one second.

If there is no trouble with the battery, the polling operations between the external equipment 9 (host side) and the micro-computer 11 (battery side) are made for monitoring at all times. If the state of "hang-up" should be produced, the indication "battery failure" is made, and the discharge from the battery pack 1 is terminated by the steps S81, S84, S85, S82 and S83 in this order.

If the normal polling operations are being performed and the computer of the external equipment 9 (host side) is operating normally, the charged voltage state of the micro-computer 11 (battery side) is inspected and the operations of detecting the battery troubles and the polling between the external equipment 9 (host side) and the micro-computer 11 (battery side) is repeated by the steps S81, S84, S85, S86 and S79 . . . in this order.

If the external equipment 9 (host side) is turned off, the discharge operation is terminated by the steps S81, S84, S85, S86 and S87 in this order.

With the above-described battery pack having the function of communication according to the present invention, since the control circuit so far provided in the charger or the external equipment is provided within the battery pack and the battery information obtained by the control circuit is suitably communicated to the external equipment, the accurate and fine-textured information concerning the battery may be obtained expeditiously.

In case of occurrence of the battery failure, the detailed state of the troubles may be positively communicated to the external equipment in order to cope with the troubles promptly.

In addition, by providing identification codes proper to the battery packs, it is possible to control the interchangeability on the side of the main body of the battery pack even if the battery pack is of the same size or has the same terminals.

What is claimed is:

1. A battery pack connected to a power source circuit and to external equipment which may also be connected to said power source circuit, wherein said power source circuit and said external equipment may be switched on and off, said battery pack comprises a secondary battery which may be charged and discharged and a control circuit for controlling the charging and discharging of said secondary battery, said control circuit comprises;
means for detecting the status of the secondary battery,
means for transmitting information based on the status of the secondary battery,
means for detecting the status of said power source circuit and said external equipment, and
means for controlling said charging and discharging of said secondary battery in response to the detected status of said power source circuit and said external equipment.

2. The battery pack as claimed in claim 1 wherein, if the battery pack malfunctions or becomes excessively discharged, warning information is transmitted via said means for transmitting information to said external equipment having the battery pack loaded thereon before operation of said external equipment is effected by said malfunction or excessive discharge.

3. The battery pack as claimed in claim 1 further comprising a communication terminal for transmission of the information in addition to a negative terminal and a positive terminal for charging/discharging.

4. The battery pack as claimed in claim 1 wherein said information having battery pack ID information for the battery pack.

5. The battery pack as claimed in claim 1 wherein said control circuit transmits the information showing the present capacity of the secondary battery to said external equipment.

6. The battery pack as claimed in claim 1 wherein said control circuit transmits the information showing a maximum capacity of the secondary battery to said external equipment.

7. The battery pack as claimed in claim 1 wherein said control circuit transmits the information showing the present current value of the secondary battery to said external equipment.

8. The battery pack as claimed in claim 1 wherein said control circuit transmits the information showing the current number of times of charging of the secondary battery to said external equipment.

9. The battery pack as claimed in claim 1 wherein said control circuit transmits the information showing the present voltage value of the secondary battery to said external equipment.

10. The battery pack as claimed in claim 1 wherein said control circuit transmits the information showing the voltage values of the cells of the secondary battery to said external equipment.

11. The battery pack as claimed in claim 5 wherein the ID information includes a model number, version, cell configuration and battery type of the battery pack.

12. The battery pack as claimed in claim 1 wherein said control circuit modifies internal settings based upon the setting information transmitted from the external equipment.

13. The battery pack as claimed in claim 12 wherein the setting information includes the setting information concerning the discharge end premonitory voltage for the secondary battery.

14. The battery pack as claimed in claim 1 wherein said control circuit returns a data code responsive to query information transmitted from said external equipment, said data code having a general code portion used as a response to an arbitrary query and a specified portion used as a response to a specified query.

15. The battery pack as claimed in claim 14 wherein the data code is a 8-bit word code, with a portion of 256 codes represented by the eight bits being used as numerical figures allocated to the general code portion, with the remaining portion of the 256 words being used as said specific code portion.

16. A battery pack with monitoring system comprising:

a battery pack comprising a secondary battery which may be charged and discharged and which is made up of a plurality of cells wherein said cells are divided into at least two groups with the groups being connected in series to each other, means for connecting said battery pack to a power source circuit and to external equipment to be powered by said battery pack, and a control circuit for controlling the charging and discharging of said secondary battery;

wherein said control circuit monitors each group of cells within the battery pack to determine the capacity of said battery pack.

17. A method of monitoring a battery pack which can be connected to a power source circuit and to external equipment which may also be connected directly to said power source circuit comprising;

providing a secondary battery which may be charged and discharged and a control circuit for controlling the charging and discharging of said secondary battery, detecting the status of said power source circuit and said external equipment, and controlling said charging and discharging of said secondary battery in response to the detected status of said power source circuit and said external equipment.

18. A method of monitoring a battery pack comprising;

providing a secondary battery which may be charged and discharged and which is made up of a plurality of cells which are divided into at least two groups wherein the groups are connected in series to each other, and providing a control circuit for controlling the charging and discharging of said secondary battery, wherein said control circuit monitors each group of cells within the battery pack.

* * * * *